US011121111B2

(12) United States Patent
Tsai et al.

(10) Patent No.: US 11,121,111 B2
(45) Date of Patent: Sep. 14, 2021

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventors: Yu-Pin Tsai, Kaohsiung (TW); Ming-Chi Liu, Kaohsiung (TW); Yu-Ting Lu, Kaohsiung (TW); Kai-Chiang Hsu, Kaohsiung (TW); Che-Ting Liu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/565,158

(22) Filed: Sep. 9, 2019

(65) Prior Publication Data
US 2021/0074664 A1   Mar. 11, 2021

(51) Int. Cl.
H01L 23/00 (2006.01)
H01L 23/31 (2006.01)
H01L 23/29 (2006.01)
H01L 23/498 (2006.01)
H01L 25/10 (2006.01)
H01L 21/683 (2006.01)
H01L 21/78 (2006.01)
H01L 21/56 (2006.01)

(52) U.S. Cl.
CPC .......... *H01L 24/24* (2013.01); *H01L 21/565* (2013.01); *H01L 21/6836* (2013.01); *H01L 21/78* (2013.01); *H01L 23/295* (2013.01); *H01L 23/3128* (2013.01); *H01L 23/49827* (2013.01); *H01L 23/49838* (2013.01); *H01L 24/05* (2013.01); *H01L 24/19* (2013.01); *H01L 24/25* (2013.01); *H01L 24/97* (2013.01); *H01L 25/105* (2013.01); H01L 2221/68381 (2013.01); H01L 2224/24226 (2013.01); H01L 2224/2518 (2013.01); H01L 2225/1035 (2013.01); H01L 2225/1041 (2013.01); H01L 2225/1058 (2013.01); H01L 2924/19102 (2013.01); H01L 2924/35121 (2013.01)

(58) Field of Classification Search
CPC ......... H01L 24/97; H01L 24/24; H01L 24/25; H01L 25/105; H01L 2225/1035
See application file for complete search history.

(56) References Cited

U.S. PATENT DOCUMENTS

| 9,087,832 | B2 * | 7/2015 | Huang | H01L 23/49822 |
| 2015/0200153 | A1 * | 7/2015 | Wang | H01L 24/94 257/774 |
| 2015/0243575 | A1 * | 8/2015 | Strothmann | H01L 24/97 257/773 |
| 2018/0076103 | A1 * | 3/2018 | Jeon | H01L 23/5385 |

(Continued)

Primary Examiner — Marcos D. Pizarro
Assistant Examiner — Antonio B Crite
(74) Attorney, Agent, or Firm — Foley & Lardner LLP

(57) ABSTRACT

A semiconductor package structure includes a semiconductor device with an active surface, a conductive pillar on the conductive pad, an adhesion strengthening layer, and an encapsulant in contact with the adhesion strengthening layer. The conductive pillar has a side surface and a top surface. The adhesion strengthening layer is conformally disposed on the side surface of the conductive pillar and the active surface of the semiconductor device.

18 Claims, 12 Drawing Sheets

(56) References Cited

U.S. PATENT DOCUMENTS

2019/0043734 A1\* 2/2019 Kapusta .............. H01L 23/3107
2019/0122899 A1   4/2019 Kwon et al.
2020/0203303 A1\* 6/2020 Lin ..................... H01L 23/5389

\* cited by examiner

SEMICONDUCTOR PACKAGE STRUCTURE AND METHOD OF MANUFACTURING THE SAME

BACKGROUND

1. Technical Field

The present disclosure relates to a semiconductor package structure. In particular, the semiconductor package structure comprises an adhesion strengthening layer conformally disposed on a side surface of a conductive pillar and an active surface of a semiconductor device.

2. Description of the Related Art

A comparative device wafer or a die to be packaged with a fan-out package operation has no passivation on its surface, for example, an active surface. A molding compound is molded on the surface of the device wafer or the die during an initial stage of the fan-out package operation. Due to insufficient adhesion between the surface of the device wafer or die and the molding compound, molding compound may be delaminated from the device wafer.

A comparative solution to solve the aforesaid delamination is to perform a plasma treatment on the surface of the device wafer or die to improve the adhesion between the surface of the device wafer and the molding compound by creating a roughened surface. However, the plasma treatment, for example, adopted in a descum operation, changes surface physical character but not the surface chemical character of the device wafer or die, therefore, delamination still occur due to various source of stress generated during manufacturing processes. Moreover, plasma treatment may attack other materials in the intermediate packaging product and create additional issues, for example, temporary molding compound deterioration, which is prone to induce molding compound overflow to the backside of the device wafer or die.

SUMMARY

In some embodiments, according to one aspect of the present disclosure, a semiconductor package structure includes a semiconductor device with an active surface, a conductive pillar on the conductive pad, an adhesion strengthening layer, and an encapsulant in contact with the adhesion strengthening layer. The conductive pillar has a side surface and a top surface. The adhesion strengthening layer is conformally disposed on the side surface of the conductive pillar and the active surface of the semiconductor device.

In some embodiments, according to one aspect of the present disclosure, a semiconductor package structure includes a first semiconductor package and a second semiconductor package. The first semiconductor package comprises a first semiconductor device with an active surface, a conductive pad on the active surface of the first semiconductor, a conductive pillar on the conductive pad, an adhesion strengthening layer, and a first encapsulant encapsulating the conductive pillar, the adhesion strengthening layer, and the active surface of the semiconductor device. The conductive pillar has a side surface and a top surface. The adhesion strengthening layer is conformally disposed on the side surface of the conductive pillar and the active surface of the first semiconductor device. The top surface of the conductive pillar is free from coverage of the adhesion strengthening layer.

In some embodiments, according to another aspect of the present disclosure, a method is disclosed for manufacturing a semiconductor package structure. The method includes the following operations: providing a tape adhered with an adhesion strengthening layer; conformally applying the tape and the adhesion strengthening layer to an active surface of a wafer; removing the tape from the wafer; curing the adhesion strengthening layer remaining on the wafer; dividing the wafer into a plurality of semiconductor devices; molding the plurality of semiconductor devices with an encapsulant thereby forming a reconstitution structure; and removing a portion of the encapsulant and the adhesion strengthening layer from the reconstitution structure.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1A:
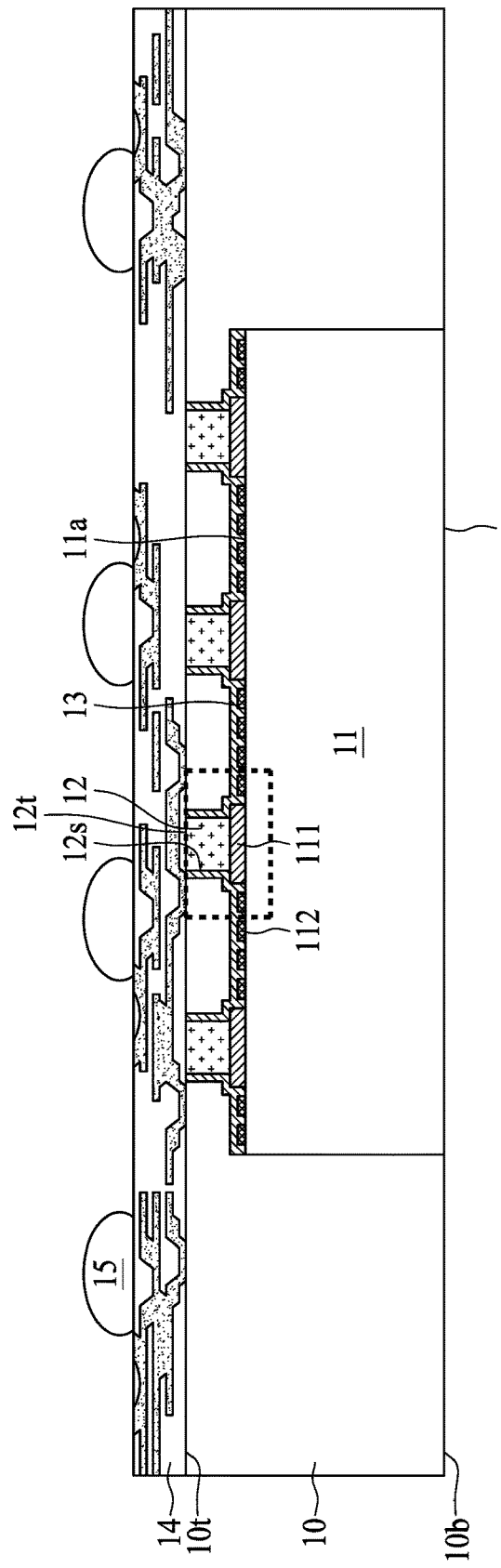
FIG. 1A illustrates a cross-sectional view of a semiconductor package structure according to some embodiments of the present disclosure.

Common reference numerals are used throughout the drawings and the detailed description to indicate the same or similar components.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A is a cross-sectional view of a semiconductor package structure 1 in accordance with some embodiments of the present disclosure. The semiconductor package structure 1 includes an encapsulant 10, a semiconductor device 11, a conductive pillar 12, an adhesion strengthening layer 13, a redistribution layer (RDL) 14, and a solder ball 15. The semiconductor package structure 1 may be an M-series package.

The encapsulant 10 has a top surface 10t and a bottom surface 10b opposite to the top surface 10t. The encapsulant 10 surrounds the semiconductor device 11. The encapsulant 10 supports the semiconductor device 11. The encapsulant 10 may include a plurality of fillers. An average filler size of the fillers of the encapsulant 10 is greater than 10 μm.

The semiconductor device 11 has an active surface 11a and a back surface 11b opposite to the active surface 11a. In some embodiments, the back surface 11b of the semiconductor device 11 may be exposed by the encapsulant 10. The semiconductor device 11 is encapsulated by the encapsulant 10. The semiconductor device 11 includes a conductive pad 111 on the active surface 11a and a conductive trace 112 on the active surface 11a. The conductive pad may include Au, Ag, Cu, Pt, Pd, alloy of the same, or other suitable materials. In some embodiments, the conductive pad 111 of the semiconductor device 11 is encapsulated by the adhesion strengthening layer 13. The conductive pad 111 of the semiconductor device 11 is further encapsulated by the encapsulant 10. The conductive trace 112 of the semiconductor device 11 is encapsulated by the adhesion strengthening layer 13. The conductive trace 112 of the semiconductor device 11 is further encapsulated by the encapsulant 10. In some embodiments, the semiconductor device 11 may include an application-specific integrated circuit (ASIC), a controller, a processor or other electronic component or semiconductor device.

The conductive pillar 12 has a side surface 12s and a top surface 12t. The top surface 12t of the conductive pillar 12 is free from coverage of the adhesion strengthening layer 13. The top surface 12t of the conductive pillar 12 is exposed from the encapsulant 10. The conductive pillar 12 is disposed on the active surface 11a of the semiconductor device 11. The conductive pillar 12 is disposed on the conductive pad 111 of the semiconductor device 11. The conductive pillar 12 extends from the conductive pad 111 of the semiconductor device 11 to the RDL 14. The conductive pillar 12 is encapsulated by the adhesion strengthening layer 13 from a lateral direction. The conductive pillar 12 is encapsulated by the encapsulant 10. The conductive pillar 12 is in contact with the conductive pad 111 of the semiconductor device 11. The conductive pillar 12 is in contact with the adhesion strengthening layer 13. The conductive pillar 12 is in contact with the RDL 14.

The adhesion strengthening layer 13 is conformally disposed on the side surface 12s of the conductive pillar 12 and the active surface 11a of the semiconductor device 11. The adhesion strengthening layer 13 is further encapsulated by the encapsulant 10. In some embodiments, the adhesion strengthening layer 13 can be a non-conductive film (NCF).

The adhesion strengthening layer 13 is distinguished from the encapsulant 10. A thickness of the adhesion strengthening layer 13 may be ranged from approximately from 10 μm to approximately 20 μm. The thickness of the adhesion strengthening layer 13 is much less than that of the encapsulant 10. The adhesion strengthening layer 13 may include a plurality of fillers. The shapes of the plurality of fillers of the adhesion strengthening layer 13 are substantially uniform. An average filler size of the fillers of the adhesion strengthening layer 13 may be smaller than 4 μm. The average filler size of the fillers of the adhesion strengthening layer 13 may be less than the average filler size of the fillers in the encapsulant 10. A size distribution of the fillers of the adhesion strengthening layer 13 is more uniform than a size distribution of the fillers of the encapsulant 10. In some embodiments, the adhesion strengthening layer 13 may have no filler.

The RDL 14 may include a conductive layer and a dielectric layer. The RDL 14 is disposed on the top surface 10t of the encapsulant 10 adjacent to a top surface 12t of the conductive pillar 12. The RDL 14 is electrically connected to the semiconductor device 11 through the conductive pillar 12. The RDL 14 is in contact with the encapsulant 10, the conductive pillar 12, and the adhesion strengthening layer 13. The solder ball 15 is disposed on the RDL 14.

Figure 1B:
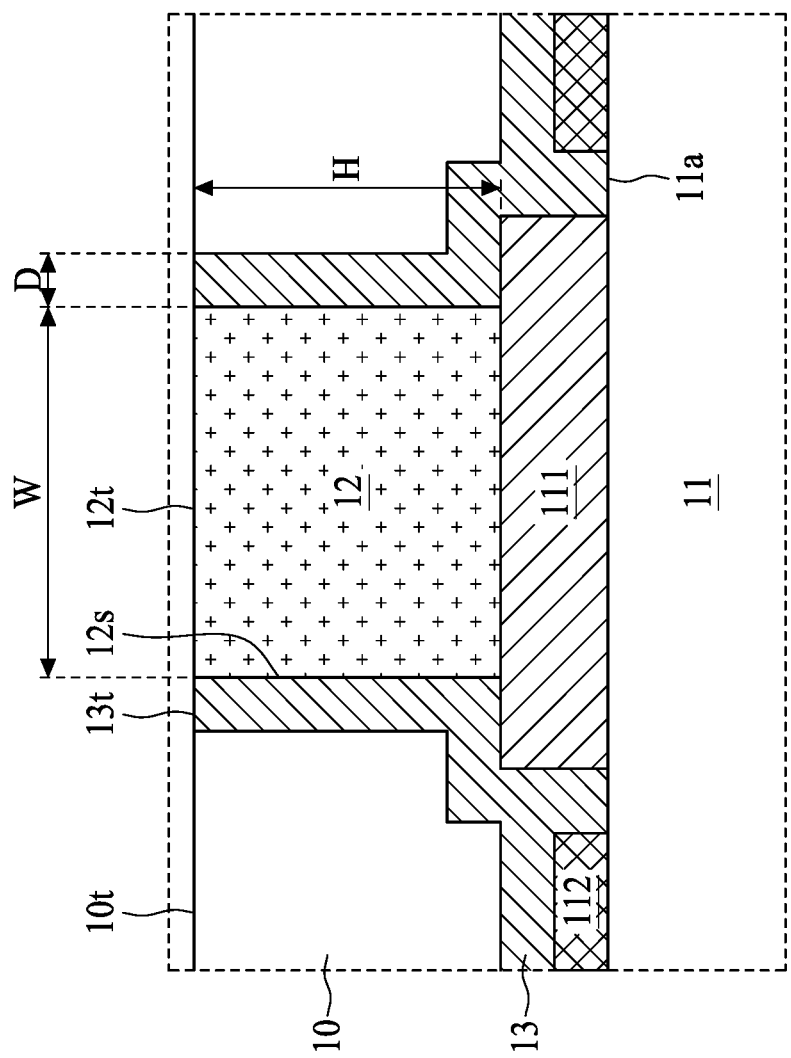
FIG. 1B illustrates a cross-sectional view of a semiconductor package structure according to some embodiments of the present disclosure.

FIG. 1B is a cross-sectional view of the semiconductor package structure 1 in accordance with some embodiments of the present disclosure. The adhesion strengthening layer 13 spaces between the active surface 11a of the semiconductor device 11 and the encapsulant 10. The adhesion strengthening layer 13 may act as a buffer layer between the encapsulant 10 and the semiconductor device 11. The adhesion strengthening layer 13 may be used for jointing the encapsulant 10 and the semiconductor device 11 so as to prevent from the encapsulant 10 being delaminated from the semiconductor device 11. Accordingly, yield and reliability of the semiconductor package structure 1 may be improved.

The adhesion strengthening layer 13 conformally covers the active surface 11a, the conductive pad 111, and the conductive trace 112 of the semiconductor device 11. The adhesion strengthening layer 13 is conformally disposed on the conductive pad 111 and the conductive trace 112 of the semiconductor device 11. The adhesion strengthening layer 13 conformally covers the side surface 12s of the conductive pillar 12. The adhesion strengthening layer 13 is in contact with the encapsulant 10. The adhesion strengthening layer 13 is in contact with the active surface 11a, the conductive pad 111, and the conductive trace 112 of the semiconductor device 11. The adhesion strengthening layer 13 is in contact with of the conductive pillar 12. The adhesion strengthening layer 13 covers the conductive pad 111 and the conductive trace 112 of the semiconductor device 11. The adhesion strengthening layer 13 encapsulates the conductive pad 111 and the conductive trace 112 of the semiconductor device 11 and the conductive pillar 12.

The conductive pillar 12 has a width W and a height H, wherein the width W may be ranged from approximately from 45 μm to approximately 200 μm, and the height H may be ranged from approximately from 30 μm to approximately 90 μm. The conductive pillar 12 is spaced from the encapsulant 10 by a distance D, wherein the distance D may be ranged from approximately from 10 μm to approximately 20 μm. The top surface 10t of the encapsulant 10, the top surface 12t of the conductive pillar 12, and a top surface 13t of the adhesion strengthening layer 13 may be substantially coplanar and in contact with a bottom surface of the RDL 14.

Figure 2:
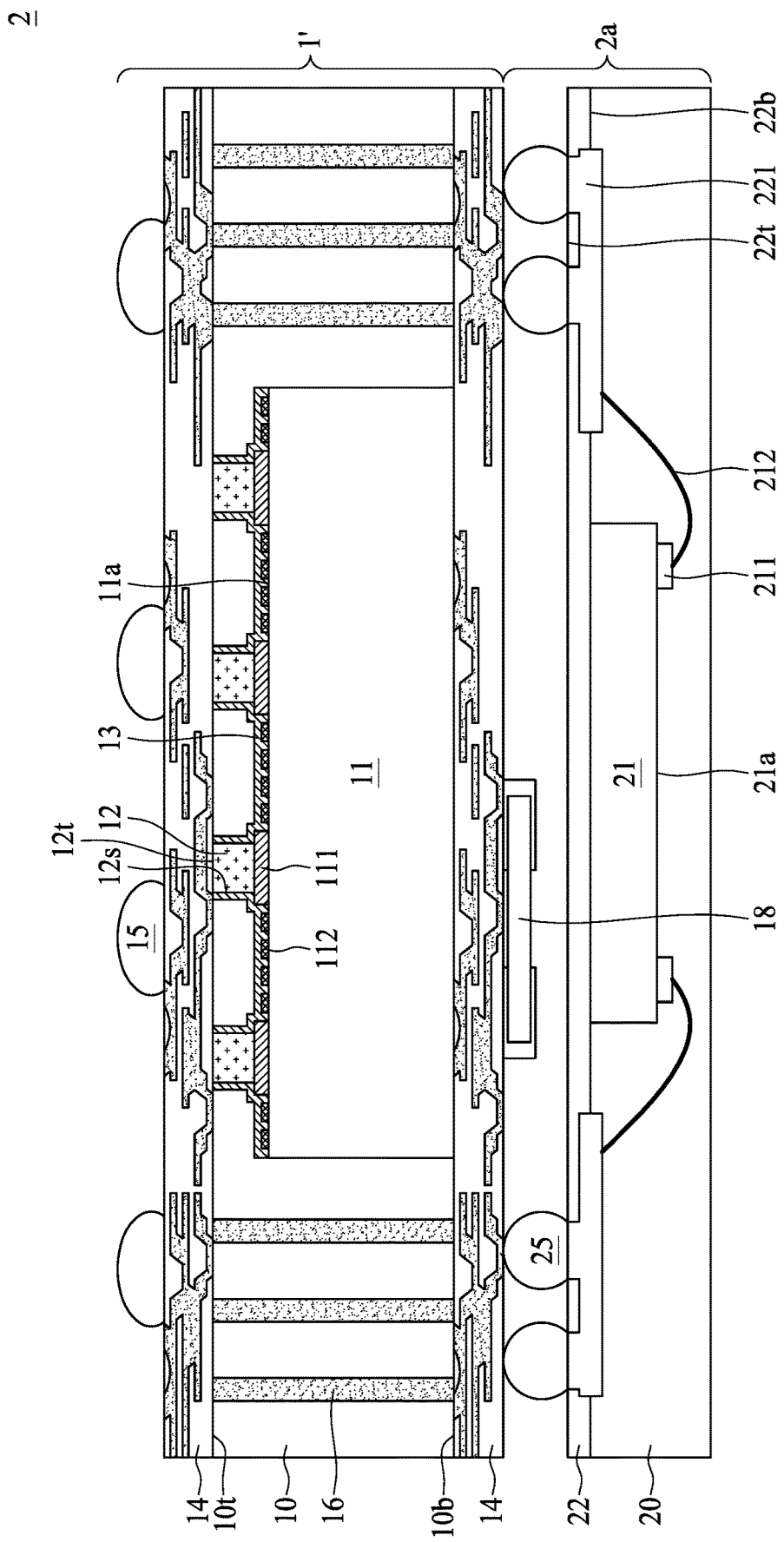
FIG. 2 illustrates a cross-sectional view of a semiconductor package structure according to some embodiments of the present disclosure.

FIG. 2 is a cross-sectional view of a semiconductor package structure 2 in accordance with some embodiments of the present disclosure. The semiconductor package structure 2 includes a semiconductor package structure 1' and a semiconductor package structure 2a. The semiconductor package structure 1' is disposed on the semiconductor package structure 2a. The semiconductor package structure 1' is electrically connected to the semiconductor package structure 2a through a connection element 25. The semiconductor package structure 2 may be a FO-POP package.

The semiconductor package structure 1' is similar to the semiconductor package structure 1 in FIG. 1A except that a conductive post 16 is disposed in the encapsulant 10 and a RDL 14 is additionally disposed on the bottom surface 10b the encapsulant 10. A passive element 18 may be disposed on the RDL 14 on the bottom surface 10b of the encapsulant 10. The passive element 18 may be a land side capacitor.

The conductive post 16 penetrates from the top surface 10t of the encapsulant 10 to the bottom surface 10b of the encapsulant 10. The conductive post 16 electrically connects the RDL 14 disposed on the top surface 10t of the encapsulant 10 to the RDL 14 disposed on the bottom surface 10b of the encapsulant 10. The conductive pillar 12 and the conductive post 16 form a fan-out connection of the semiconductor device 11.

The semiconductor package structure 2a includes a substrate 22, a semiconductor device 21, and an encapsulant 20.

The connection element 25 is disposed on a top surface 22t of the substrate 22. The connection element 25 may be a solder ball.

The substrate 22 has a patterned conductive layer 221. In some embodiments, the substrate 22 may be or include, for example, a printed circuit board, such as a paper-based copper foil laminate, a composite copper foil laminate, or a polymer-impregnated glass-fiber-based copper foil laminate. The substrate 22 may include a core layer which is made of a bismaleimide-triazine (BT) resin or a glass-reinforced epoxy composite (e.g., an FR-4 composite). The substrate 22 may include an interconnection structure connected to the patterned conductive layer 221, such as a redistribution layer (RDL) or a grounding element. In some embodiments, the grounding element is a via that is exposed from a lateral surface of the substrate 22. In some embodiments, the grounding element is a metal layer exposed from the lateral surface of the substrate 22. In some embodiments, the grounding element is a metal trace exposed from the lateral surface of the substrate 22.

The semiconductor device 21 is disposed on a bottom surface 22b of the substrate 22. The semiconductor device 21 includes a conductive pad 211 and a conductive wire 212. The semiconductor device 21 includes an active surface 21a. In some embodiments, the semiconductor device 21 may be a flip-chip type. The semiconductor device 21 may be the same as or different from the semiconductor device 11.

The encapsulant 20 is disposed on the bottom surface 22b of the substrate 22. The encapsulant 20 encapsulates the semiconductor device 21.

Figure 3:
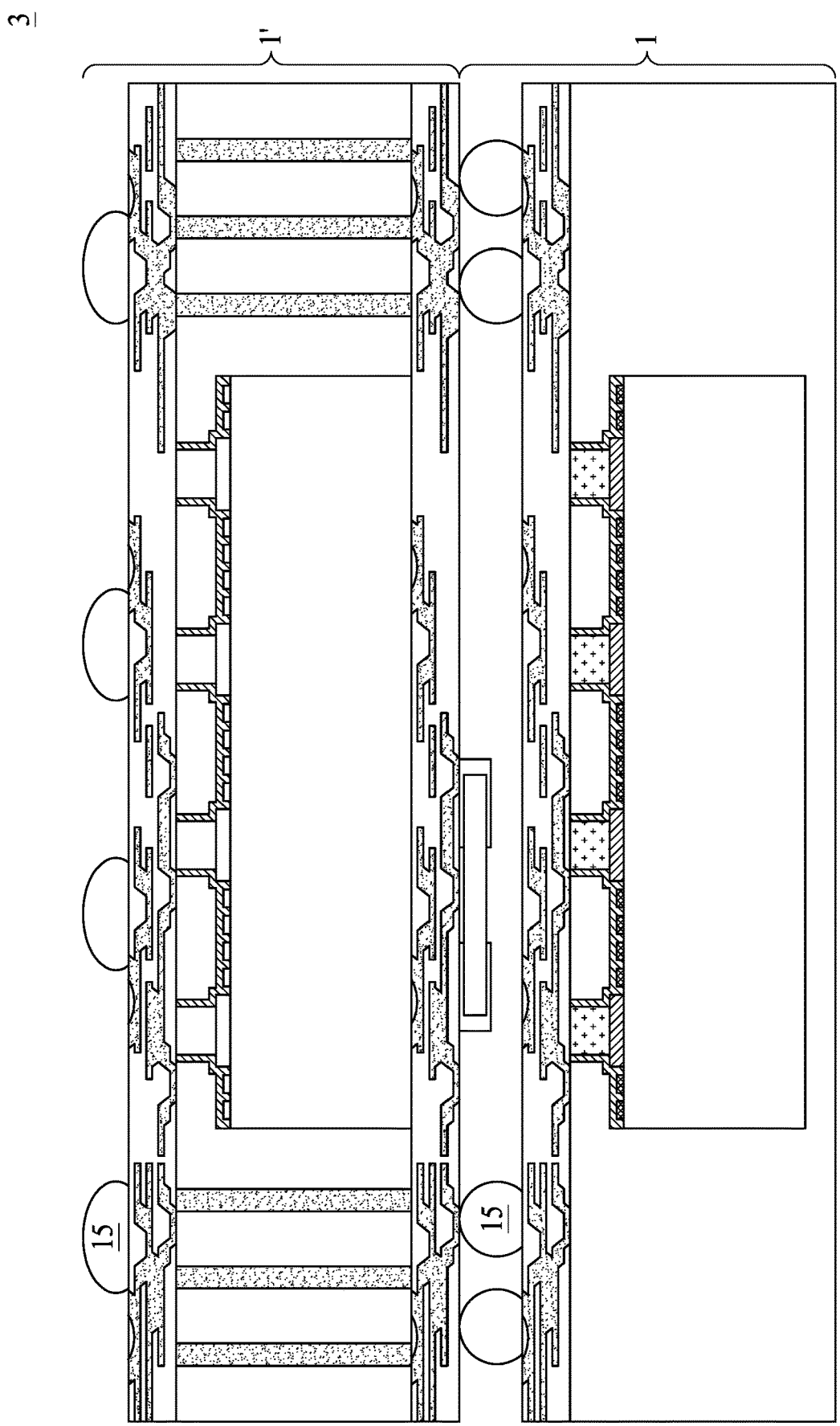
FIG. 3 illustrates a cross-sectional view of a semiconductor package structure according to some embodiments of the present disclosure.

FIG. 3 is a cross-sectional view of a semiconductor package structure 3 in accordance with some embodiments of the present disclosure. The semiconductor package structure 3 includes the semiconductor package structure 1 and the semiconductor package structure 1'. The semiconductor package structure 1' is disposed on the semiconductor package structure 1. The semiconductor package structure 1' is electrically connected to the semiconductor package structure 1 through the solder ball 15. The semiconductor package structure 3 may be a FO-3D package.

FIG. 4A through FIG. 4H illustrate some embodiments of a method of manufacturing a semiconductor package structure 1 according to some embodiments of the present disclosure. Various figures have been simplified to more clearly present aspects of the present disclosure.

Figure 4A:
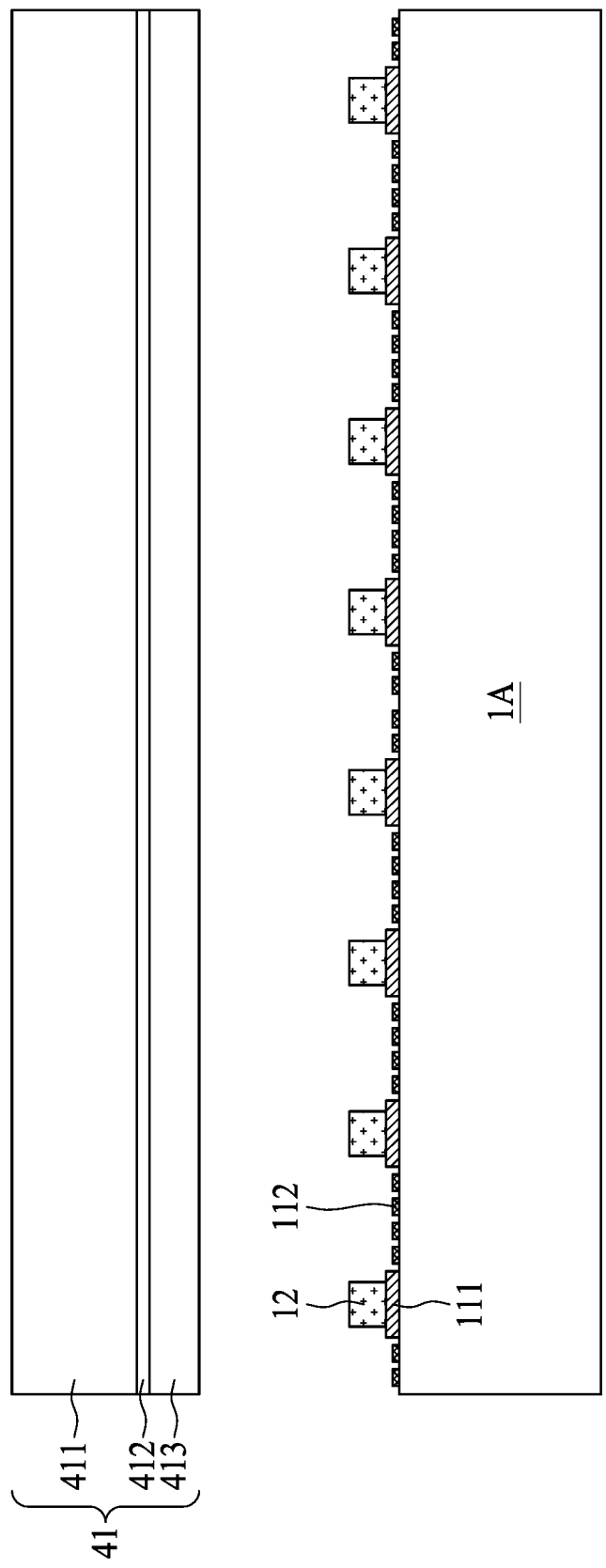
FIG. 4A, FIG. 4B, FIG. 4C, FIG. 4D, FIG. 4E, FIG. 4F, FIG. 4G, and FIG. 4H illustrate intermediate operations of a method for manufacturing a semiconductor package structure according to some embodiments of the present disclosure.

Referring to FIG. 4A, the method for manufacturing the semiconductor package structure 1 includes providing a wafer 1A and a film structure 41. The wafer 1A may be a device wafer having conductive pads 111 and conductive traces 112 on an active surface thereof. A conductive pillar 12 may be formed on one of the conductive pads 111 of the wafer 1A. In some embodiments, the conductive pillars 12 may be formed over the conductive pads 111 when coming from an upstream manufacturer, for example, a foundry. In some embodiments, the conductive pillars 12 may possess a pitch about 300 μm. In some embodiments, only the conductive pads 111 are formed on the wafer 1A when coming from an upstream manufacturer, for example, a foundry. In some embodiments, the conductive pads 111 may possess a pitch about 300 μm.

In some embodiments, the film structure 41 can be a 2-in-1 structure including a tape 411, an adhesion strengthening layer 413, and an UV adhesive 412 bonding the tape 411 and the adhesion strengthening layer 413. Alternatively stated, the tape 411 is adhered with the adhesion strengthening layer 413 through the UV adhesive 412. In some embodiments, the tape 411 is a back grinding tape, the adhesion strengthening layer 413 is composed of non-conductive material, and the UV adhesive 412 is sensitive to UV light in that the adhesion property may be altered by shining UV light thereon. The film structure 41 is conformally applied to and laminated on an active surface of the wafer 1A. The adhesion strengthening layer 413 may fully fill space between adjacent conductive pads 111 and adjacent conductive traces 112. The adhesion strengthening layer 413 may completely cover the conductive pillar 12 and the wafer 1A. The tape 411 and the adhesion strengthening layer 413 may be slightly deformed when conformally laminating the film structure 41 on the active surface of the wafer 1A, so as to form direct contact between the adhesion strengthening layer 413 and the sidewall of the conductive pillar, as well as the adhesion strengthening layer 413 and the exposed portion of the conductive pad 111.

In some embodiments, the wafer 1A may include an application-specific integrated circuit (ASIC), a controller, a processor, a MEMS device, a memory, or other electronic component or semiconductor device. In some embodiments, the conductive pillar includes copper pillar of an M-series package.

Figure 4B:
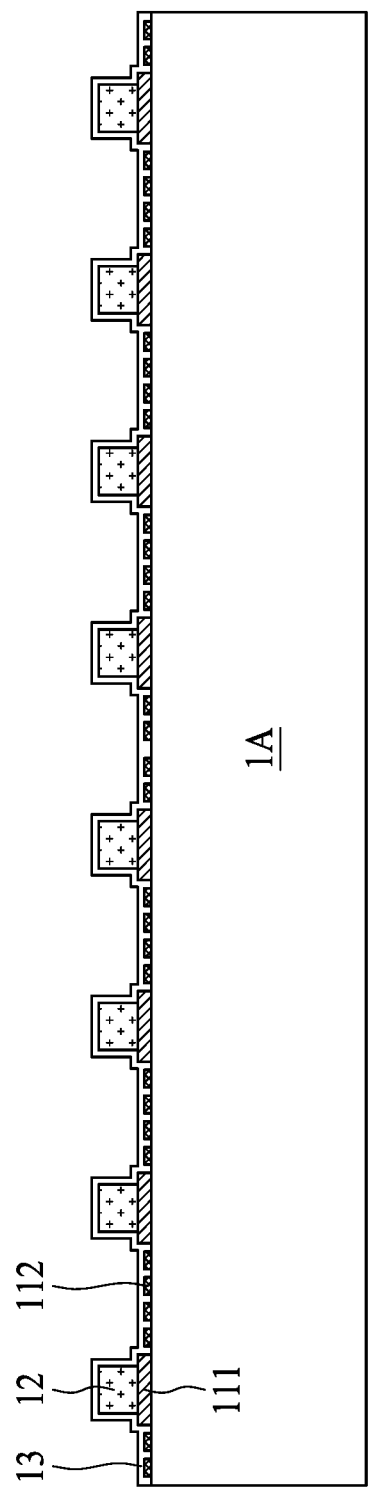

Referring to FIG. 4B, the film structure 41 is illuminated by a UV light to decrease the adhesion between the tape 411 and the adhesion strengthening layer 413. The tape 411 is illuminated by the UV light. The UV adhesive 412 is illuminated by the UV light. The tape 411 and the UV adhesive 412 may be removed from the adhesion strengthening layer 413. Subsequently, a curing operation is performed to cure the adhesion strengthening layer 413, thereby forming a cured adhesion strengthening layer 13 attaching to the top surface and the side surface of the conducive pillar 12, the top surface and side surface of the conductive pads 111, as well as the top surface and side surface of the conductive traces 112.

Figure 4C:
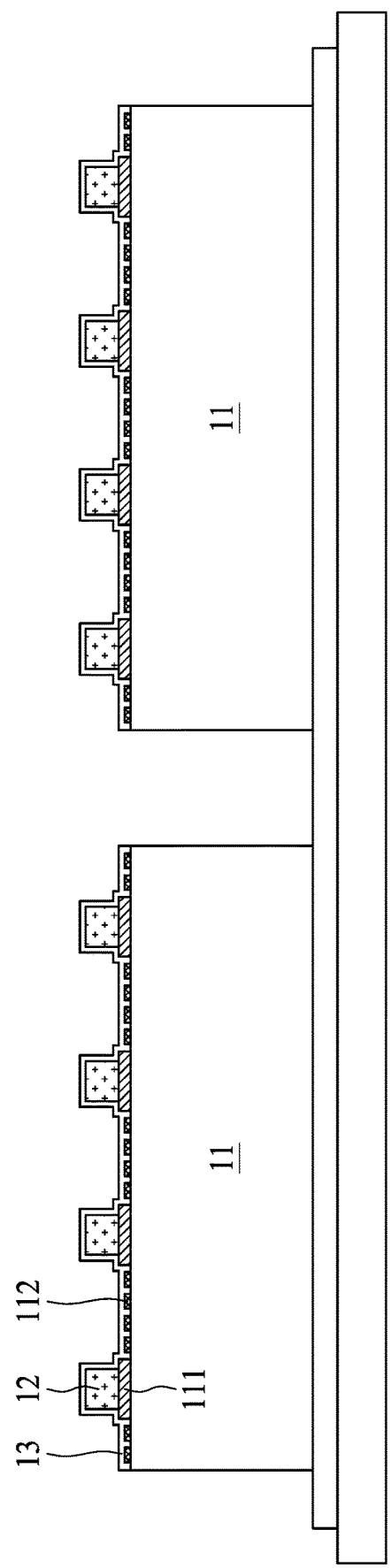

Referring to FIG. 4C, the wafer 1A can be divided into a plurality of semiconductor devices 11 by, for example, applying a diamond blade on the saw street between adjacent die areas.

Figure 4D:
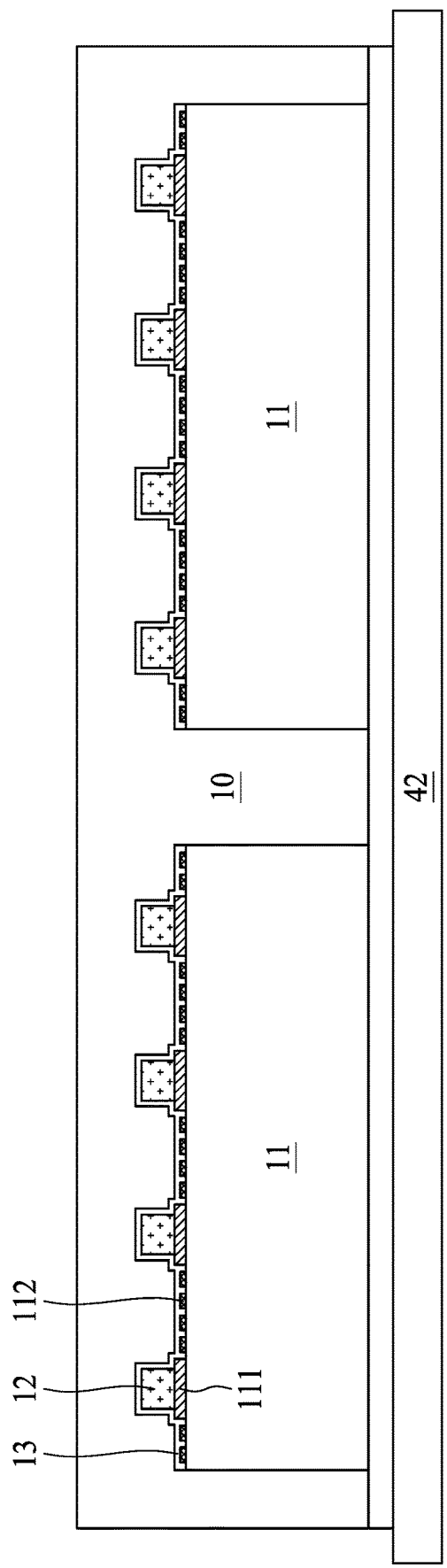

Referring to FIG. 4D, the plurality of semiconductor devices 11 are picked and placed on a carrier 42 ready for a reconstitution operation. Subsequently, an encapsulant 10 is disposed on the carrier 42 by a molding operation to form a reconstitution structure. The encapsulant 10 encapsulates the plurality of semiconductor devices 11. The encapsulant 10 encapsulates the adhesion strengthening layer 13 on semiconductor device 11. The encapsulant 10 encapsulates the conductive pillar 12 on semiconductor device 11. In some embodiments, the encapsulant 10 is spaced from the conductive pillar 12, the conductive pads 111, and the conductive traces 112 by the adhesion strengthening layer 13.

Figure 4E:
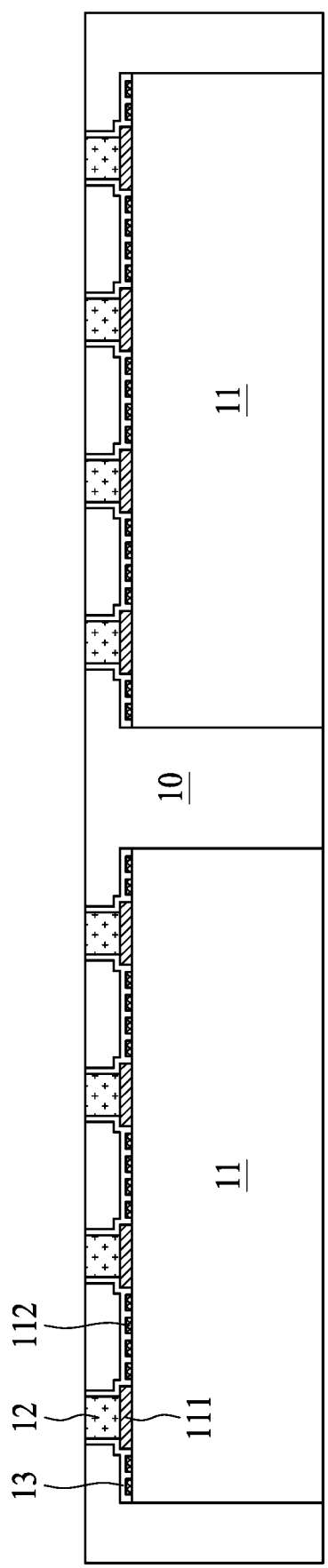

Referring to FIG. 4E, a grinding operation is performed to remove a portion of the encapsulant 10 from the reconstitution structure. After the grinding operation, a top surface of the conductive pillar 12 is exposed from the grinded encapsulant 10. A top surface of the encapsulant 10, the top surface of the conductive pillar 12, and a top surface of the adhesion strengthening layer 13 may be substantially coplanar. Subsequently, the carrier 42 is removed to expose backsides of the plurality of semiconductor devices 11.

Figure 4F:
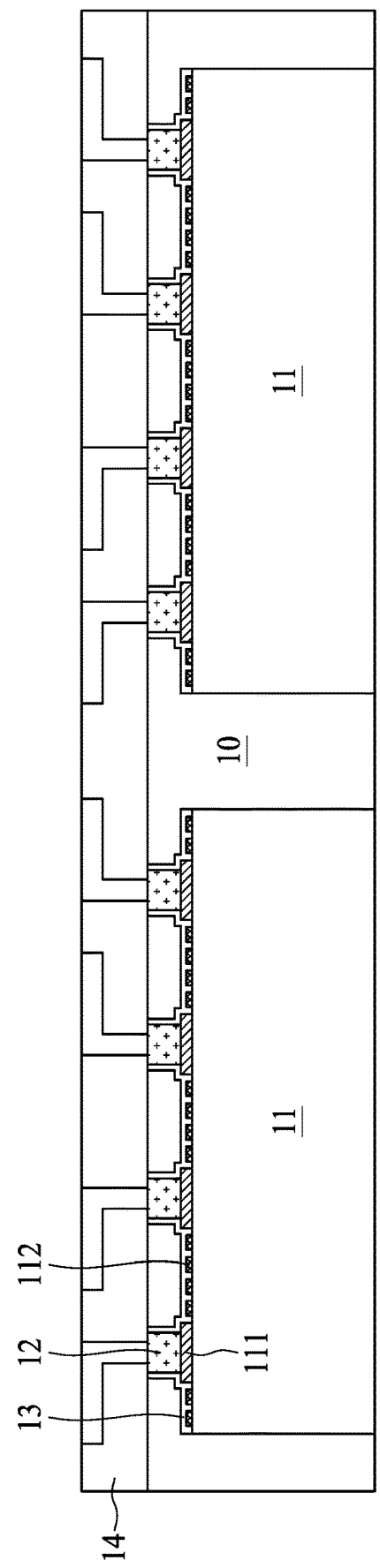

Referring to FIG. 4F, an RDL 14 is formed over the reconstitution structure. The RDL 14 is disposed on the top surface of the encapsulant 10, the top surface of the conductive pillar 12, and a top surface of the adhesion strengthening layer 13. The RDL 14 is electrically connected to the plurality of semiconductor devices 11 via the conductive pillars 12.

Figure 4G:
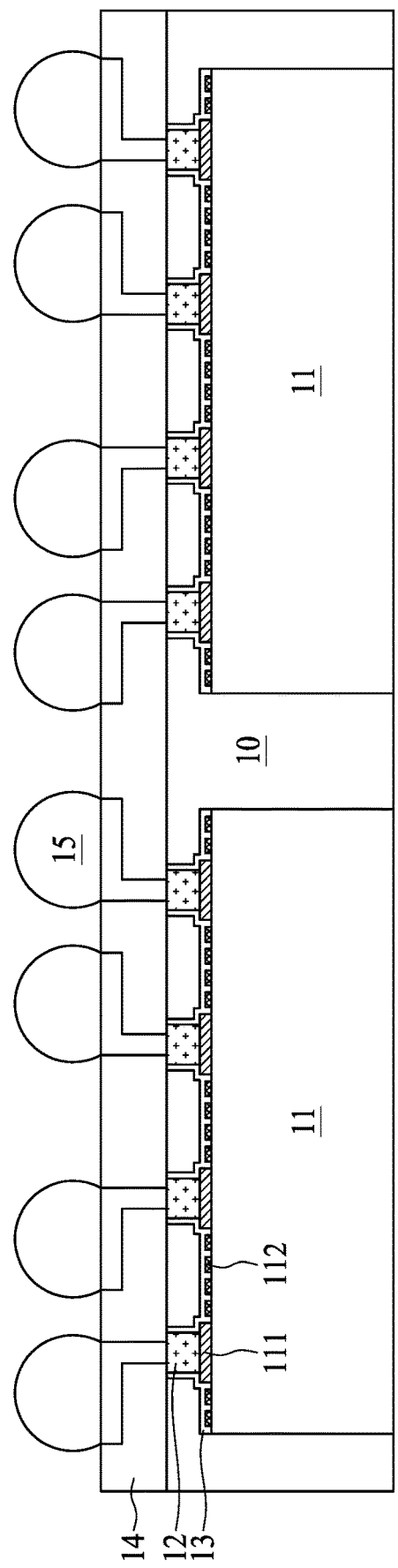

Referring to FIG. 4G, a solder ball 15 is disposed on the RDL 14 via a ball drop operation.

Figure 4H:
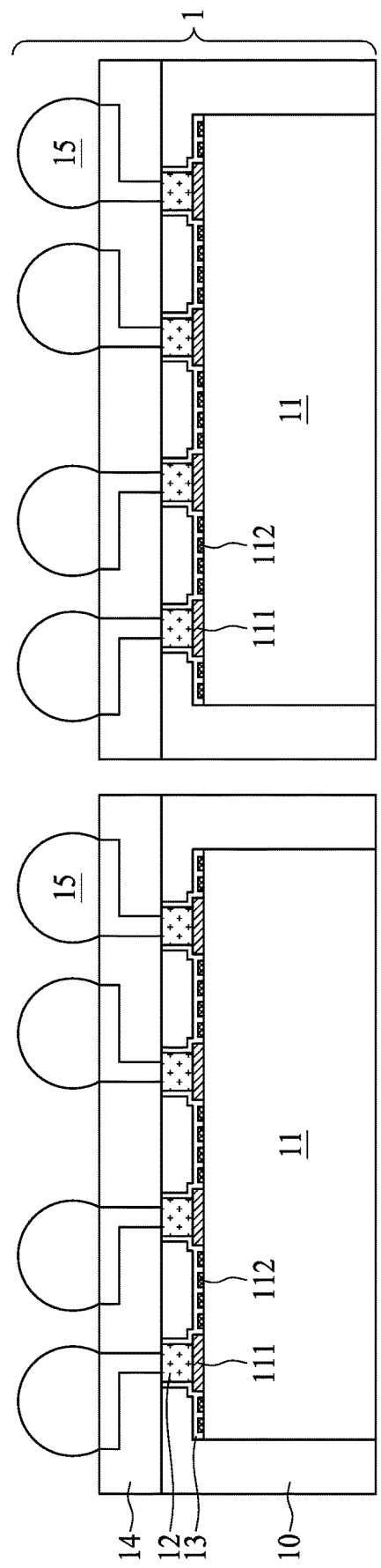

Referring to FIG. 4H, a package saw operation is performed to form the semiconductor package structure 1.

As used herein, spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
a semiconductor device with an active surface;
a conductive pillar, the conductive pillar having a side surface and a top surface;
an adhesion strengthening layer conformally disposed on the side surface of the conductive pillar and the active surface of the semiconductor device; and
an encapsulant in contact with the adhesion strengthening layer,
wherein the encapsulant comprises a plurality of first fillers, and the adhesion strengthening layer comprises a plurality of second fillers, a size distribution of the second fillers is more uniform than a size distribution of the first fillers.

2. The semiconductor package structure of claim 1, wherein the adhesion strengthening layer spaces between the active surface of the semiconductor device and the encapsulant.

3. The semiconductor package structure of claim 1, wherein a backside of the semiconductor device is exposed by the encapsulant.

4. The semiconductor package structure of claim 1, wherein the adhesion strengthening layer is a non-conductive film.

5. The semiconductor package structure of claim 1, wherein a thickness of the adhesion strengthening layer is in a range from approximately 10 μm to approximately 20 μm.

6. The semiconductor package structure of claim 1, further comprising a conductive pad on the active surface of the semiconductor device, wherein the conductive pillar is disposed on the conductive pad.

7. The semiconductor package structure of claim 6, wherein an average filler size of the second fillers is smaller than 4 μm.

8. The semiconductor package structure of claim 6, further comprising a conductive trace on the active surface, the adhesion strengthening layer further conformally covering the conductive pad and the conductive trace.

9. The semiconductor package structure of claim 1, wherein the top surface of the conductive pillar is exposed from the encapsulant.

10. The semiconductor package structure of claim 9, further comprising a first redistribution layer (RDL) disposed on a top surface of the encapsulant adjacent to the top surface of the conductive pillar and electrically connected to the semiconductor device through the conductive pillar.

11. The semiconductor package structure of claim 10, further comprising a conductive post disposed in the encapsulant, wherein the conductive post penetrates from the top surface of the encapsulant to the bottom surface of the encapsulant.

12. The semiconductor package structure of claim 11, further comprising a second RDL disposed on the bottom surface of the encapsulant, wherein the first RDL is electrically connected to the second RDL through the conductive post.

13. A semiconductor package structure, comprising:
a first semiconductor package, comprising:
  a first semiconductor device with an active surface;
  a conductive pad on the active surface of the first semiconductor;
  a conductive pillar on the conductive pad, the conductive pillar having a side surface and a top surface;
  an adhesion strengthening layer conformally disposed on the side surface of the conductive pillar and the active surface of the first semiconductor device, the top surface of the conductive pillar being free from coverage of the adhesion strengthening layer; and
  a first encapsulant encapsulating the conductive pillar, the adhesion strengthening layer, and the active surface of the semiconductor device;
a second semiconductor package electrically coupled to the first semiconductor package through the conductive pillar; and
a conductive post in the first encapsulant, the conductive pillar and the conductive post form a fan-out connection of the first semiconductor device.

14. The semiconductor package structure of claim 13, further comprising a connection element disposed between the first semiconductor package and the second semiconductor package.

15. The semiconductor package structure of claim 13, wherein the first semiconductor package further comprises a first RDL disposed on the top surface of the first encapsulant and electrically connected to the first semiconductor device through the top surface of the conductive pillar.

16. The semiconductor package structure of claim 13, wherein the second semiconductor package further comprises:
  a substrate having a top surface and a bottom surface opposite to the top surface;
  a second semiconductor device disposed on the bottom surface of the substrate; and
  a second encapsulant disposed on the substrate and encapsulating the second semiconductor device.

17. The semiconductor package structure of claim 13, wherein the first encapsulant comprises a plurality of first fillers, and the adhesion strengthening layer comprises a plurality of second fillers, a size distribution of the second fillers is more uniform than a size distribution of the first fillers.

18. The semiconductor package structure of claim 13, wherein the adhesion strengthening layer comprises a non-conductive film without fillers.

* * * * *